(12) United States Patent
Ye

(10) Patent No.: US 10,549,313 B2
(45) Date of Patent: Feb. 4, 2020

(54) EDGE FIELD IMPRINT LITHOGRAPHY

(71) Applicant: Canon Kabushiki Kaisha, Tokyo (JP)

(72) Inventor: Zhengmao Ye, Austin, TX (US)

(73) Assignee: Canon Kabushiki Kaisha, Tokyo (JP)

(*) Notice: Subject to any disclaimer, the term of this patent is extended or adjusted under 35 U.S.C. 154(b) by 39 days.

(21) Appl. No.: 15/339,281

(22) Filed: Oct. 31, 2016

(65) Prior Publication Data

US 2018/0117626 A1    May 3, 2018

(51) Int. Cl.
*B05D 3/12* (2006.01)
*B05D 3/06* (2006.01)

(52) U.S. Cl.
CPC .............. *B05D 3/12* (2013.01); *B05D 3/067* (2013.01)

(58) Field of Classification Search
CPC .................................. B05D 3/12; B05D 3/067
See application file for complete search history.

(56) References Cited

U.S. PATENT DOCUMENTS

| | | |
|---|---|---|
| 6,932,934 B2 | 8/2005 | Choi |
| 8,470,188 B2 | 6/2013 | Menezes |
| 8,641,958 B2 | 2/2014 | Khusnatdinov |
| 8,967,992 B2 | 3/2015 | Khusnatdinov |
| 2004/0124566 A1 | 7/2004 | Sreenivasan |
| 2004/0188381 A1 | 9/2004 | Sreenivasan |
| 2004/0211754 A1 | 10/2004 | Sreenivasan |
| 2007/0102844 A1* | 5/2007 | Simon ............... B29C 59/022 264/259 |
| 2007/0138699 A1* | 6/2007 | Wuister ............... B82Y 10/00 264/319 |
| 2011/0031650 A1* | 2/2011 | McMackin ........... B82Y 10/00 264/293 |
| 2018/0104888 A1 | 4/2018 | Ye |

FOREIGN PATENT DOCUMENTS

EP         2240826 A1     10/2010

* cited by examiner

*Primary Examiner* — James M Mellott
(74) *Attorney, Agent, or Firm* — Canon U.S.A., Inc. IP Division

(57) ABSTRACT

Methods, systems, and apparatus, including computer programs encoded on a computer storage medium, for an imprint lithography method of edge field patterning, the method including providing a template having a mold, the mold having a patterning surface comprising patterned features; providing a substrate having an edge step layer positioned thereon the edge step layer including a sloped profile; depositing a polymerizable material on the edge step layer of the substrate; contacting the polymerizable material at one or more of a plurality of edge fields located at a perimeter of the substrate with the mold of the template; and based on the contacting, forming a pattern based on the patterned features at the one or more edge fields to provide an edge field pattern, wherein contact between the template and the substrate proximate to the plurality of edge fields is prevented based on the edge step layer of the substrate.

13 Claims, 6 Drawing Sheets

US 10,549,313 B2

EDGE FIELD IMPRINT LITHOGRAPHY

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

Nano-fabrication can include imprinting of a full field or a partial field. A full field is a field in which all of an imprinting field of a template overlies all of a substrate and its corresponding overlying formable material. A partial field is a field in which only part and not all of an imprinting field of a template overlies the substrate or a portion of substrate where edge effects of the substrate are significant, for example, over a portion of the substrate that has a contoured (rounded) edge.

SUMMARY

Innovative aspects of the subject matter described in this specification may be embodied in methods that include the actions of providing an imprint lithography template having a mold, the mold having a patterning surface comprising patterned features; providing a substrate having an edge step layer positioned thereon the edge step layer including a sloped profile; depositing a polymerizable material on the edge step layer of the substrate; contacting the polymerizable material at one or more of a plurality of edge fields located at a perimeter of the substrate with the mold of the imprint lithography template; and based on the contacting, forming a pattern based on the patterned features at the one or more edge fields to provide an edge field pattern, wherein contact between the imprint lithography template and the substrate proximate to the plurality of edge fields is prevented based on the edge step layer of the substrate.

Other embodiments of these aspects include corresponding systems, apparatus, and computer programs, configured to perform the actions of the methods, encoded on computer storage devices.

These and other embodiments may each optionally include one or more of the following features. For instance, contact between the imprint lithography template and the substrate proximate to the plurality of edge fields is prevented based on a height of the edge step layer. Contact between the imprint lithography template and the substrate proximate to the plurality of edge fields is prevented based on the sloped profile of the edge step layer. Identifying a degree of bending of the template at the perimeter of the substrate, wherein a height of the edge step layer is based on the degree of bending. The height of the edge step layer ranges from ten nanometers to three microns. Identifying a degree of bending of the template at the perimeter of the substrate, wherein a slope of the sloped profile at the perimeter of the substrate is based on the degree of bending. The edge step layer further includes fluid control features positioned proximate the perimeter of the substrate. Contact between the imprint lithography template and the substrate at the plurality of edge fields is prevented based on i) a height of the edge step layer of the substrate, and ii) the sloped profile of the edge step layer.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

This document describes methods and systems that prevent contact between an imprint lithography template and a substrate proximate to edge fields positioned at a perimeter of the substrate. Specifically, the imprint lithography template includes a mold, the mold having a patterning surface including patterned features. The substrate has an edge step layer positioned thereon that includes a sloped profile. A polymerizable material is deposited on the edge step layer. The mold of the imprint lithography template contacts the polymerizable material at a plurality of the edge fields located at a perimeter of the substrate. Based on the contacting, a pattern is formed at the edge fields based on the patterned features to provide an edge field pattern. The edge step layer and the sloped profile prevent contact between the imprint lithography template and the substrate at the edge fields. In some examples, contact between the template and the substrate proximate to the edge fields is prevented based on the edge step layer. In some examples, contact between the template and the substrate proximate to the edge fields is prevented based i) a height of the edge step layer, and ii) the sloped profile of the edge step layer.

Figure 1:
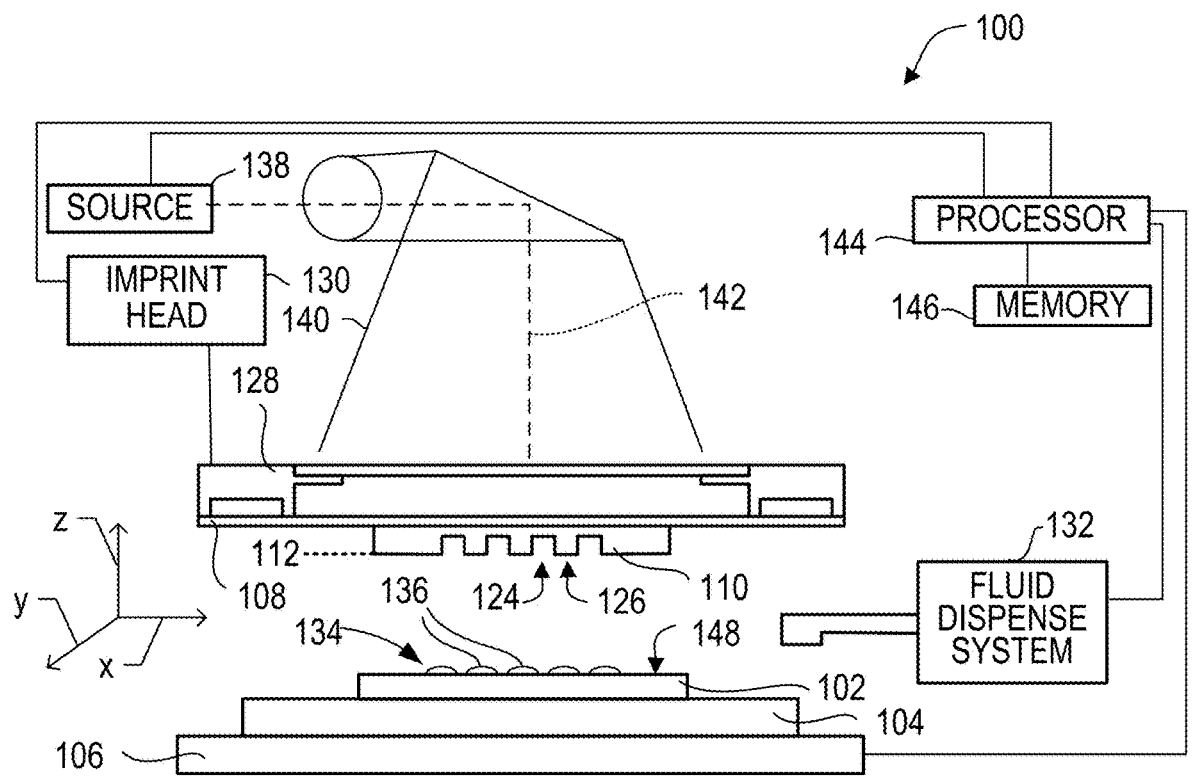
FIG. 1 illustrates a simplified side view of a lithographic system in accordance with embodiments of the present invention.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 122 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. Further, the template chuck 128 may be coupled to an imprint head 130 such that the template chuck 128 and/or the imprint head 130 may be configured to facilitate movement of the template 118.

The imprint lithography system 100 may further comprise a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may comprise a monomer as described in U.S. Pat. Nos. 7,157,036 and 8,076,386, all of which are hereby incorporated by reference herein. In some examples, the polymerizable material 134 is positioned upon the substrate 102 as a plurality of droplets 136.

Figure 2:
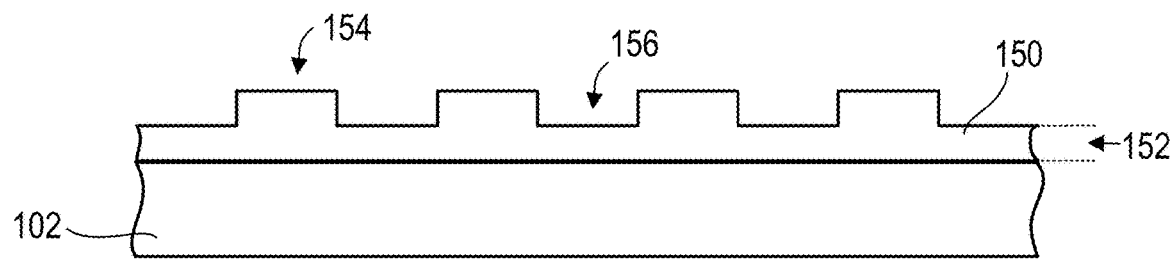
FIG. 2 illustrates a simplified side view of the substrate shown in FIG. 1 having a patterned layer positioned thereon.

Referring to FIGS. 1 and 2, the imprint lithography system 100 may further comprise an energy source 138 coupled to direct energy 140 along a path 142. In some examples, the imprint head 130 and the stage 106 is configured to position the template 108 and the substrate 102 in superimposition with the path 142. The imprint lithography system 100 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 40, e.g., broadband ultraviolet radiation, causing the polymerizable material 134 to solidify and/or cross-link conforming to shape of a surface 148 of the substrate 102 and the patterning surface 112, defining a patterned layer 150 on the substrate 102. In some examples, the patterned layer 150 may comprise a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

Figure 3:
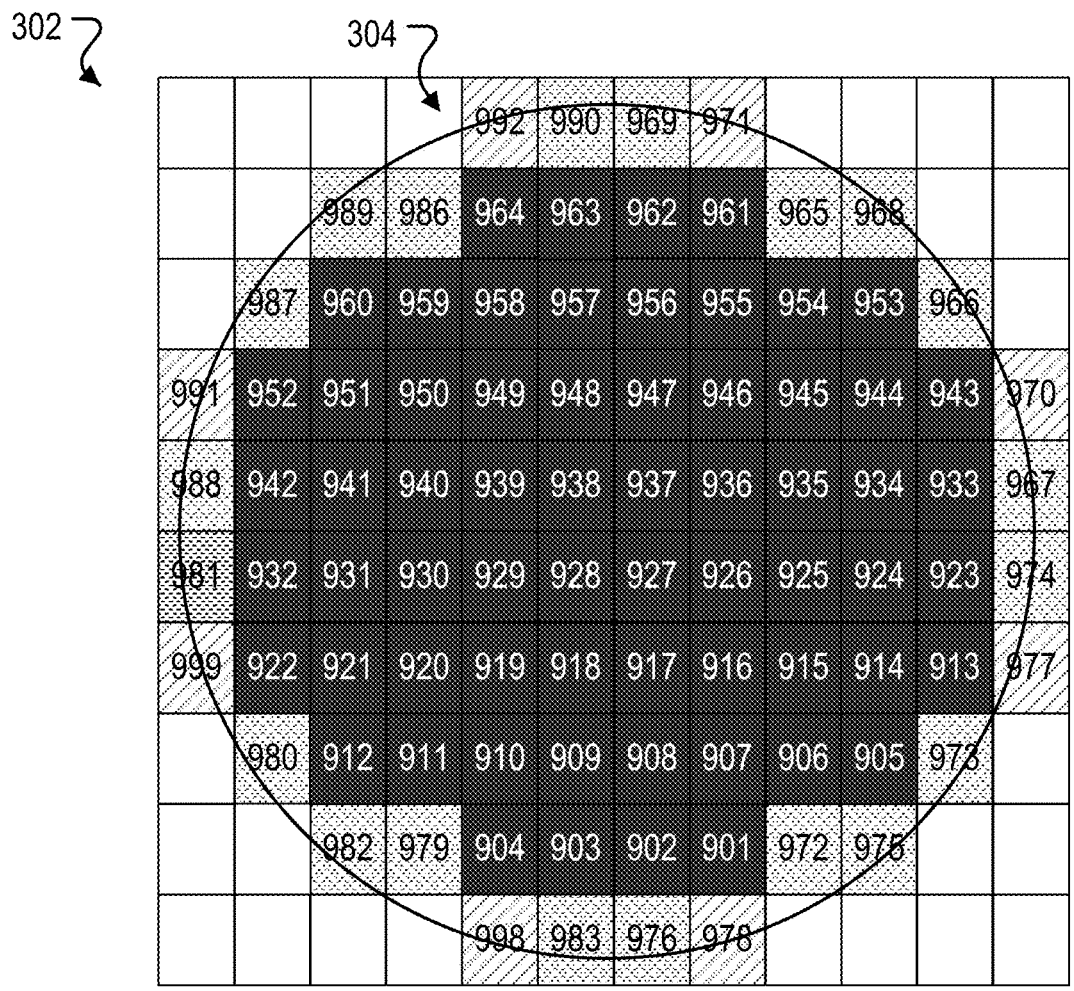
FIG. 3 illustrates a top view of the substrate in relation to imprint fields.

FIG. 3 illustrates a top down view of a substrate 302, similar to the substrate 102, including a plurality of fields. Specifically, the substrate 302 includes a plurality of edge fields positioned at a perimeter 304 of the substrate 302. In the illustrated example, the substrate 302 includes full imprint fields (e.g., 901, 902, 963, 964—collectively referred to as full imprint fields) and partial imprint fields (e.g., 965, 966, 991, 992—collectively referred to as partial imprint fields). In some examples, the partial imprint fields are referred to as edge fields.

In some examples, the full imprint fields include a full area that can be imprinted by the entire patterning surface 122 of the mold 110. In some examples, the partial imprint fields generally refer to imprint fields that are positioned proximate to the perimeter 304 of the substrate 302 (e.g., at or near the substrate's edge) that have less than the full area that could otherwise be imprinted by the entire patterning surface 122 of the mold 110. In some examples, the partial imprint fields include two sub-categories based on the area of the partial field. For example, (i) partial imprint fields with more than 50% area coverage (>50% partial fields), and (ii) partial imprint fields with less than 50% area coverage (<50% partial fields). For example, at least imprint fields 965 to 969, 972 to 976, 979, 980 to 983, and 986 to 990 are >50% partial imprint fields; and at least imprint fields 970, 971, 977, 978, 991, and 992 are <50% partial imprint fields.

To that end, during partial field imprinting, that is, patterning of the edge fields of the substrate 302, it is desired to prevent contact between the template 108 and substrate 302 proximate to the edge fields. Specifically, contact between the template 108 and the substrate 302 can result in partial field defect transfer. Partial field defect transfer includes transfer of imprint defects to subsequently patterned fields (full-field or partial field). Specifically, during an initial patterning of the fields of the substrate 302 utilizing the template 108, the template 108 can contact a portion of the substrate 302 (e.g., near the perimeter 304 of the substrate 302). As a result of such contact, the template 108 can be damaged and/or become contaminated with small (sub-micron) particle contaminants (e.g., a small particle positioned on the substrate 302 can become lodged in the features of, or otherwise become adhered to, template 108). To that end, during subsequent pattering of additional fields by the template 108, the defect of the template 108 from the previous patterning can be transferred to the additional fields. For example, such defect transfer can include non-patterning or mis-patterning of locations in the additional fields due to the template feature damage and/or exclusion zones created by particle contamination, and/or transferring particle contaminants to the additional fields. In some examples, partial field defect transfer can result in non-recoverable template damage.

Furthermore, during partial field imprinting, a low alignment control force (e.g., less than 5 Newtons) is desired. to facilitate an improved overlay performance. Specifically, frictional forces can be created during potential contact between the substrate 302 and the template 108 that necessitate high alignment control forces (e.g., greater than 50 Newtons). To that end, by preventing direct contact between the template 108 and the substrate 302 proximate to the edge fields (e.g., without imprint resist positioned therebetween), application of the high alignment control forces is prevented, and overlay performance is improved (e.g., less than 20 nanometers).

Figure 4:
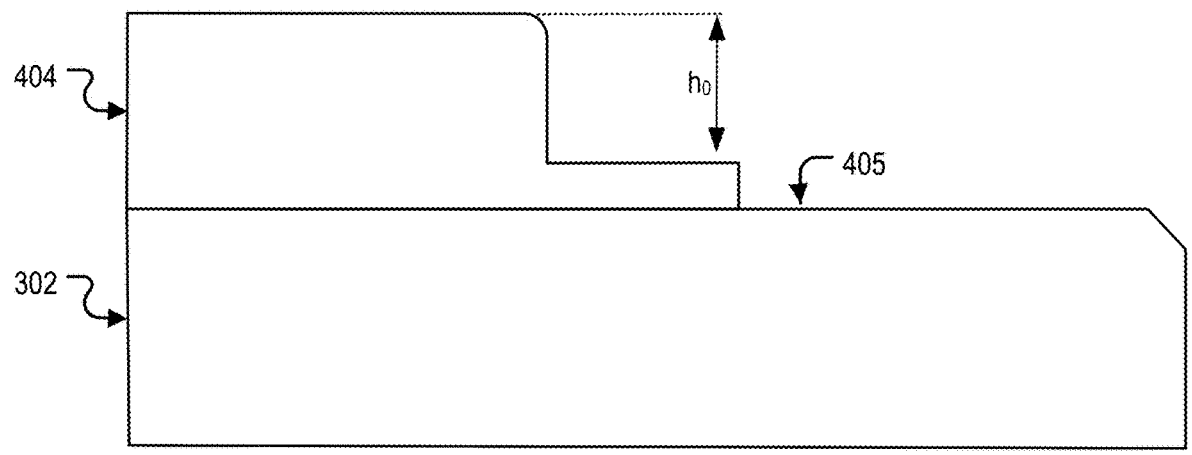
FIG. 4 is a side view of the substrate and an edge step layer.

FIG. 4 illustrates the substrate 302, such as silicon wafer, having an edge step layer 404 positioned on a surface 405 of the substrate 302, similar to the surface 148 of FIG. 1. The edge step layer 404 can be generated with any processing method known in the art to position any material (e.g., the polymerizable material 132) on the edge step layer 404. In some examples, the edge step layer 404 is formed utilizing such methods as material coating with edge bead removal (chemically and optically), mechanically machining the edge of substrate 302 (mechanically), and chemically etching the edge of the substrate 302. In some examples, the edge step layer 404 has a height $h_0$ associated therewith. In some examples, the height $h_0$ is greater than 10 nanometers. In some examples, the height $h_0$ is less than two to three microns.

Figure 5:
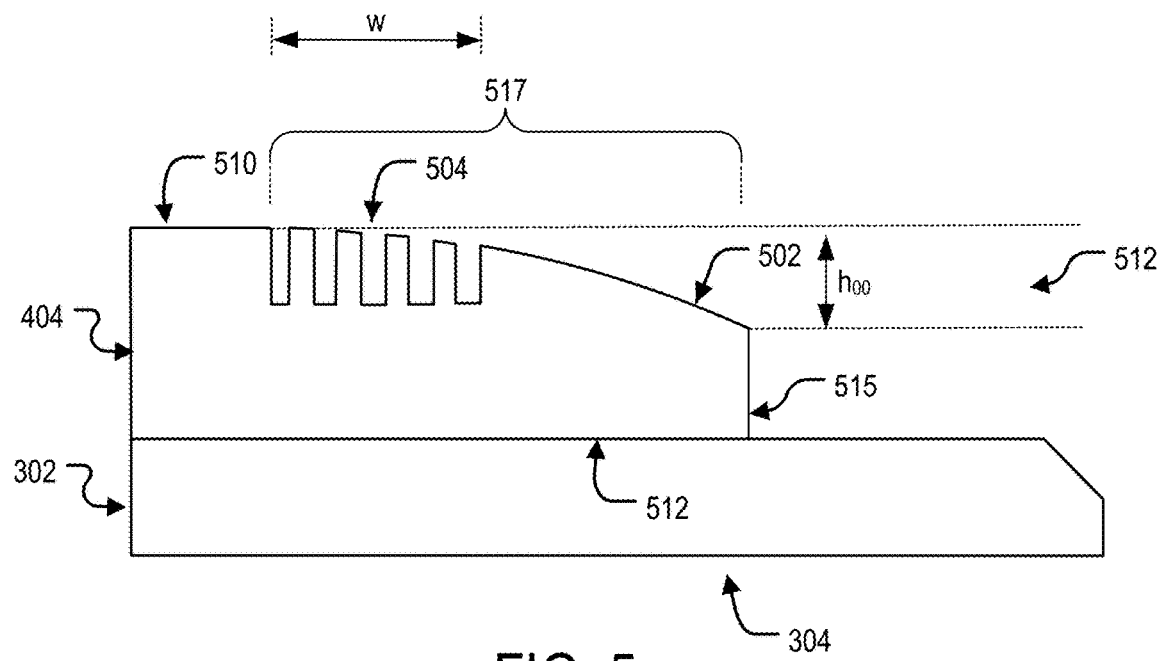
FIG. 5 is a side view of the substrate including a sloped profile and fluid control features.

FIG. 5 illustrates the edge step layer 404 including a sloped profile 502.

Specifically, the sloped profile 502 is an interface between a surface 510 of the edge step layer 404 (e.g., surface having the polymerizable material 406 positioned thereon) and a surface 512 of the edge step layer 404 (e.g., surface in contact with the substrate 302). In other words, the sloped profile 502 is a profile of an edge region 517 of the edge step layer 404. In some examples, the edge region 517 of the edge step layer 404, including the sloped profile 502, is in superimposition with the perimeter 304 of the substrate 302. In some examples, the edge step layer 404 includes an edge surface 515 that is defined between the sloped profile 502 and the surface 512 of the substrate 302. In some examples, the sloped profile 502 includes the edge surface 515.

In some examples, a slope of the sloped profile 502 can included a curved profile; however, other profiles are possible, including a straight line profile. In some examples, the slope of the sloped profile 502 can have a value between 0 and 10 mrad (e.g., 2 microns height change over 200 micron distance). In short, the sloped profile 502 of the edge step layer 404 provides a gap 512, defined between the surface 510 of the edge step layer 404 and the edge surface 515 of the edge step layer. The gap 512 provides additional spacing between the template 108 and the substrate 302 at the perimeter of the substrate 302. In some examples, the gap 512 has a height $h_{00}$ associated therewith. In some examples, the height $h_{00}$ is between 0 and 2 microns.

Figure 6:
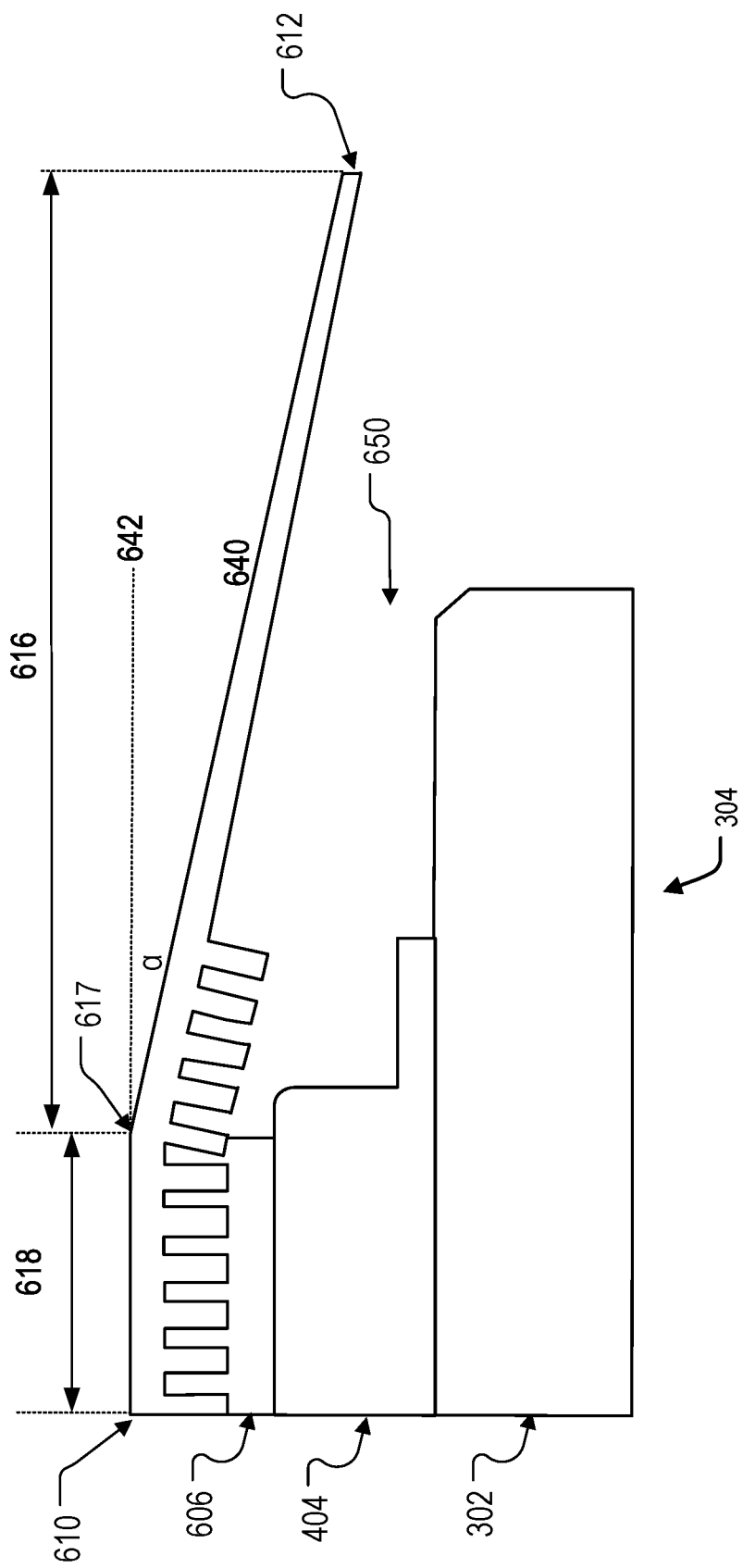
FIG. 6 is a side view of a template in contact with a polymerizable material.

FIG. 6 illustrates a mold 610, similar to the mold 110 of FIG. 1, of a template 612, similar to the template 108 of FIG. 1, contacting a polymerizable material 606 on the substrate 302. Specifically, the mold 610 contacts the polymerizable material 606, similar to the polymerizable material 136 of FIG. 1, that is positioned proximate to edge fields (and/or the perimeter 304) of the substrate 302, as described above with respect to FIG. 3. The polymerizable material 606 is deposited on the edge step layer 404 such that the edge step layer 404 is positioned between the polymerizable material 606 and the substrate 302.

During contact between the mold 610 and the polymerizable material 606, it is desirable to minimize, if not prevent, contact between the template 612 (and/or the mold 610) and the substrate 302 that is proximate to the edge fields (and/or the perimeter 304). Specifically, during contact between the mold 610 and the polymerizable material 606, bending (e.g., distortion) of the template 612 (and/or mold 610) can occur. In the illustrated example, a first region 616 of the template 612 is bent about a point 617 with respect to a second region 618 of the template 612. Bending of the first region 616 can include any type of bending (e.g., curvature) that causes the first region 616 to be positioned closer to the substrate 302 (e.g., proximate the edge fields and/or the perimeter 304) as compared to other regions of the template 612, e.g., the second region 618. In some examples, bending of the template 612 can be the result of capillary forces between the substrate 302 and the template 612 during patterning of the polymerizable material 606. In other examples, bending of the template 612 can be the result of imprint control conditions to meet specific imprint application requirements. To that end, bending of the template 612 can potentially result in contact between the template 612 (e.g., the first region 616) and the substrate 302 (e.g., proximate to the edge fields and/or the perimeter 304), which is undesirable. Such contact can result in partial field defect transfer, high alignment control force, and/or degraded overlay performance, as described above. In some examples, the first region 616 of the template 612 is bent about multiple points towards the perimeter 304 of the substrate 302.

In some implementations, the edge step layer 404 can minimize and/or prevent such contact between the template 612 (e.g., the region 616) and the substrate 302 (e.g., proximate to the edge fields). Specifically, a degree of bending of the template 612 proximate to the perimeter 304 of the substrate 302 is identified. In some examples, the degree of bending of the template 612 can be based on a degree between a plane 640 of the first region 616 and a plane 642 of the second region 618, show as an angle α. In some examples, the angle α is between 0 and 100 s μrad. In some examples, the angle α is a predetermined constant angle.

To that end, in some examples, the height $h_0$ of the edge step layer 404, shown in FIG. 4, and the slope of the sloped profile 502, shown in FIG. 5, are based on the degree of bending of the template 612, e.g., the magnitude of the angle α, proximate to the edge fields and the perimeter 304 of the substrate 302. Specifically, the height $h_0$ of the edge step layer 404 and the slope of the sloped profile 502 are both of a respective magnitude such that when the first region 616 of the template 612 is bent towards the substrate 302, contact between the template 612 and the substrate 302 is prevented (or, in some examples, minimized). That is, there exists a gap 650 between the template 612 and the substrate 302 proximate the perimeter 304 when the first region 616 of the template 612 is bent towards the substrate 302. In some examples, the gap 650 can have a value between zero to several microns depending on specific imprint applications.

Figure 8:
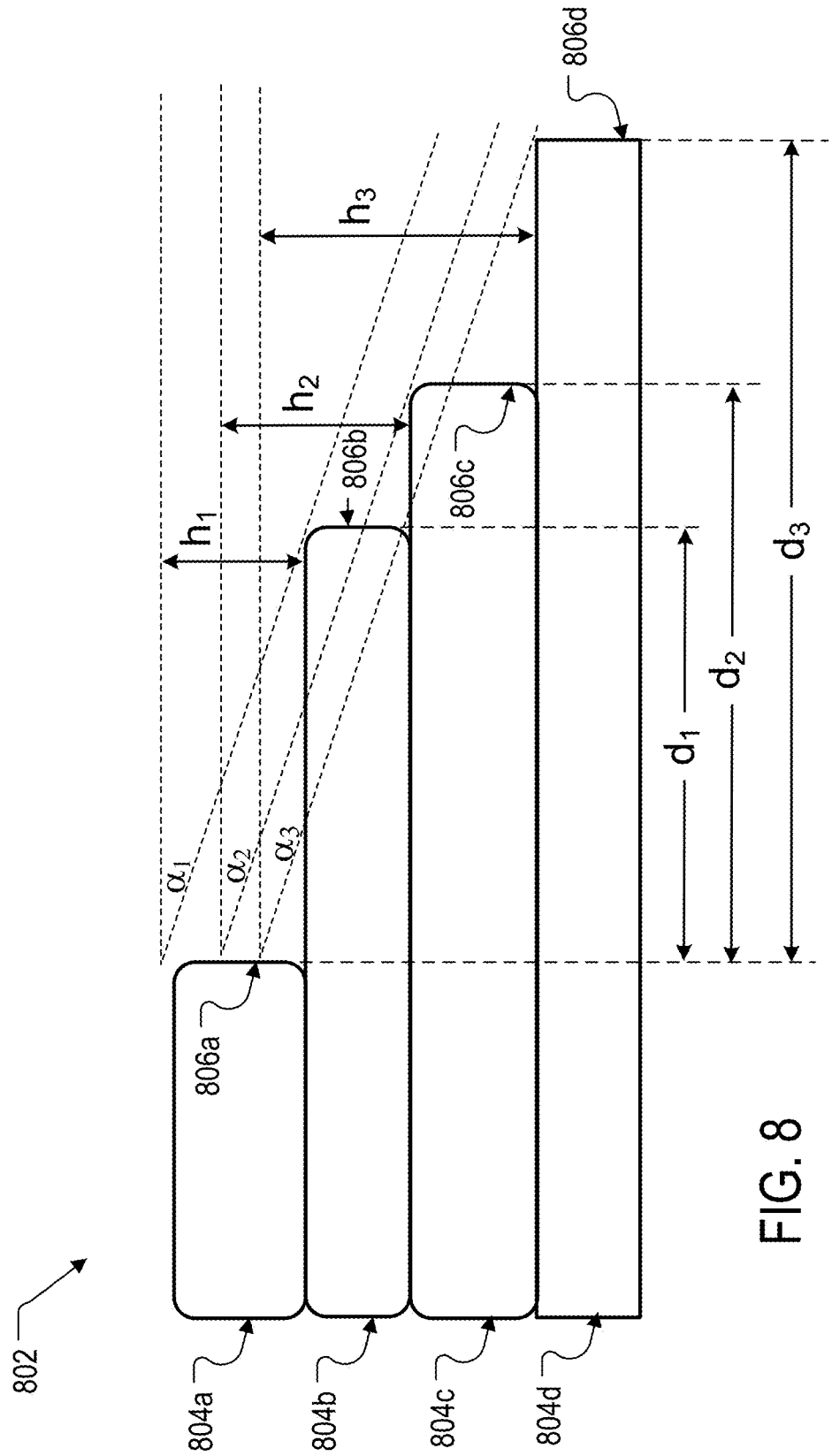
FIG. 8 is a side view of a multi-edge substrate.

In some examples, predictive modeling of the magnitude of the height $h_0$ of the edge step layer 404 can be based on an edge distance of the edge step layer 404 and the angle α. FIG. 8 illustrates a multi-edge substrate 802 having edge step layers 804a, 804b, 804c, 804d (commonly referred to as edge step layers 804). The edge step layers 804 are similar to the edge step layer 404 of FIG. 4. The edge step layers 804a, 804b, 804c, 804d are each associated with a thickness $t_1$, $t_2$, $t_3$, $t_4$, respectively. Furthermore, the edge step layer 804b is associated with an edge distance $d_1$ measured from an edge 806a of the edge step layer 804a to an edge 806b of the edge step layer 804b. Similarly, the edge step layer 804c is associated with an edge distance $d_2$ measured from the edge 806a of the edge step layer 804a to an edge 806c of the edge step layer 804c. Lastly, the edge step layer 804d is associated with an edge distance $d_3$ measured from the edge 806a of the edge step layer 804a to an edge 806d of the edge step layer 804d.

For each edge step layer 804, a height $h_n$ is determined based on parameters associated with contact between a template (e.g., the template 612) and the respective edge step layer 804 at the edge 806 of the edge step layer 804. Specifically, the height $h_n$ associated with each edge step layer 804 is based on the respective edge step distance $d_n$, and the angle $\alpha_n$ associated with a degree of bending of the template (e.g., the degree of bending of the template 612 between a plane 640 of the first region 616 and a plane 642 of the second region 618) for the particular edge step layer 804 that results in contact at the edge 806 of the particular edge step layer 804. To that end, for a particular edge step layer 804, the height $h_n$ is calculated as:

$$h_n = d_n \times \tan \alpha_n.$$

For example, for the edge step layer 804b, the height $h_1$ is calculated as:

$$h_1 = d_1 \times \tan \alpha_1.$$

For example, for the edge step layer 804c, the height $h_2$ is calculated as:

$$h_2 = d_2 \times \tan \alpha_2.$$

For example, for the edge step layer 804d, the height $h_3$ is calculated as:

$$h_3 = d_3 \times \tan \alpha_3.$$

To that end, an edge step height $h_0$ of the edge step layer 404 is determined such that contact between the template (e.g., the template 612) and the substrate (e.g., the substrate 302) is prevented (or, in some examples, minimized). Specifically, the edge step height $h_0$ is determined based on the height $h_n$ and thicknesses $t_n$ associated with the edge step layers 804. To that end, the edge step height $h_0$ is determined as:

$$h_0 = \max(d_n \times \tan \alpha_n - \Sigma_{n=2}^n t_n)$$

In the illustrated example, the height $h_0$ is determined as:

$$h_0 = \max[h_1, (h_2 - t_2), (h_3 - t_2 - t_3)].$$

In some examples, each of the angles $\alpha_n$ is substantially the same (e.g., $\alpha_1 = \alpha_2 = \alpha_3$) and is a predetermined constant. In some implementations, based on the contact between the mold 610 and the polymerizable material 606, a pattern is formed based on the patterned features of the mold 610 (similar to the patterned features of the patterning surface 122 of FIG. 1) at the edge fields of the substrate 302, providing an edge field pattern, similar to that mentioned above with respect to FIGS. 1 and 2.

Referring to FIGS. 5 and 6, in some further implementations, the edge step layer 404 includes fluid control features (FCF) 504 positioned proximate to the edge region 517 of the edge step layer 404. Specifically, the FCF 504 include features that control the flow of the polymerizable material 606—(e.g., within tens of microns proximate to the edge surface 515) on the edge step layer 404. In some examples, a width w of the FCF 504 can vary from several microns to several tens of microns. In some examples, the FCF 504 include a plurality of protrusions and recessions, however, other types of features are possible.

In some examples, the FCF 504 helps to control a distribution of the polymerizable material 606 on the edge step layer 404 such that the polymerizable material 606 does not spread beyond the edge step layer 404 to the substrate 302, e.g., beyond the edge surface 515. However, to minimize contact between the template 612 and the substrate 302 proximate to the perimeter 304 of the substrate 302, the polymerizable material 606 is positioned proximate the edge region 517 of the edge step layer 404, e.g., less than 300 microns from the edge step layer 404. Thus, the FCF 504 facilitate control of the polymerizable material 606 within this range to i) prevent spreading of the polymerizable material 606 beyond the edge step layer 404 while ii) preventing contact between the template 612 (e.g., the first region 616) and the substrate 302 (e.g., proximate to the edge fields). In some examples, the range includes tens of microns to hundreds of microns. In some implementations, the height $h_1$ of the edge step layer 404, the sloped profile 502 of the edge step layer 404, and the FCF 504 minimize and/or prevent such contact between the template 612 (e.g., the first region 616) and the substrate 302 (e.g., proximate to the edge fields and/or the perimeter 302).

Figure 7:
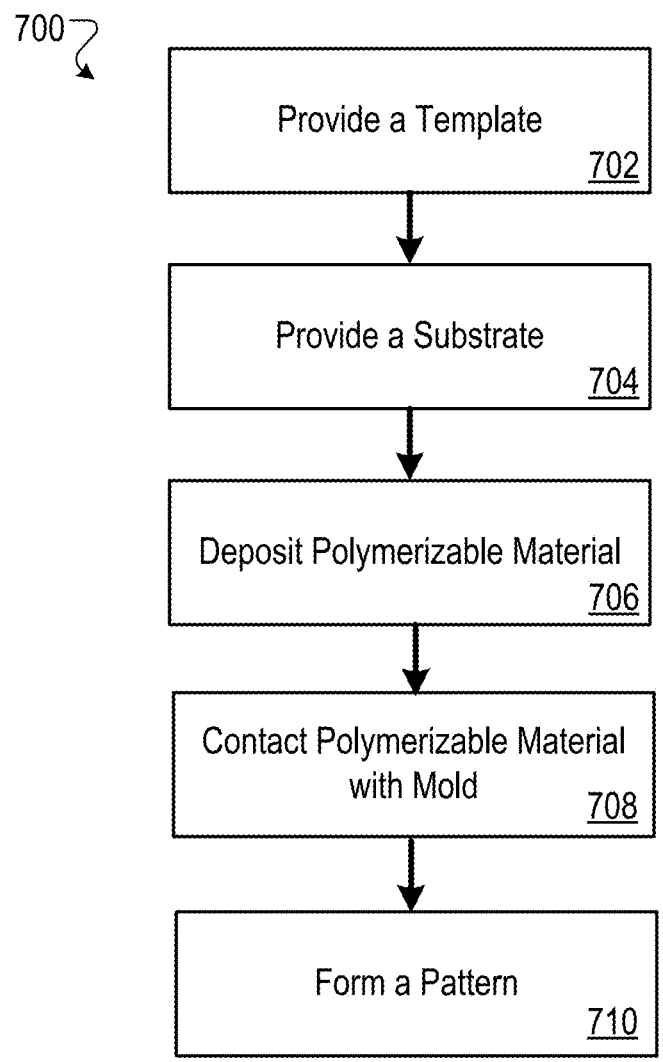
FIG. 7 is an example process for patterning a substrate.

FIG. 7 illustrates an example method for patterning a substrate. The process 700 is illustrated as a collection of referenced acts arranged in a logical flow graph. The order in which the acts are described is not intended to be construed as a limitation, and any number of the described acts can be combined in other orders and/or in parallel to implement the process. An imprint lithography template having a mold is provided (702). For example, the template 612 is provided having the mold 610. In some examples, the mold has a patterning surface comprising patterned features. A substrate is provided having an edge step layer positioned thereon, and a plurality of edge fields positioned at the perimeter of the substrate (704). For example, the substrate 302 is provided having the edge step layer 404 positioned thereon, and edge positioned at the perimeter 304 of the substrate 302. In some examples, the edge step layer 404 includes the sloped profile 502. A polymerizable material is deposited on the edge step layer of the substrate (706). For example, the polymerizable material 606 is deposited on the edge step layer 404 of the substrate 302. The polymerizable material is contacted at the edge fields with the mold of the imprint lithography template (708). For example, the polymerizable material 606 is contacted at the edge fields with the mold 610 of the template 612. Based on the contacting, a pattern is formed based on the patterned features at the edge fields to provide an edge field pattern (710). In some examples, contact between the template 612 and the substrate 302 proximate to the edge fields is prevented based on the edge step layer 404 of the substrate 302. In some examples, contact between the template 612 and the substrate 302 proximate to the edge fields is prevented based i) the height $h_1$ of the edge step layer 404, and ii) the sloped profile 502 of the edge step layer 404. In some examples, contact between the template 612 and the substrate 302 proximate to the edge fields is prevented based i) the height $h_1$ of the edge step layer 404, ii) the sloped profile 502 of the edge step layer 404, and iii) the FCF 504.

The invention claimed is:

1. An imprint lithography method of edge field patterning, the method comprising:
   providing an imprint lithography template having a mold, the mold having a patterning surface comprising patterned features;
   providing a substrate having a surface defining a first edge and an imprinting area having full imprint fields bounded by partial imprint fields, wherein each partial imprint field is bounded by up to two full imprint fields and has an edge step layer extending from the surface of the substrate, the edge step layer having a second edge a distance d from the first edge and a height h defined by a distance between the surface of the substrate and a surface of the edge step layer parallel to the surface of the substrate from which it extends, wherein a portion of the surface of the substrate between the first edge and the second edge is free of the edge step layer;

drop dispensing a polymerizable material on the surface of the edge step layer of one of the partial imprint fields;

contacting the polymerizable material on the edge step layer with the mold of the imprint lithography template; and based on the contacting, forming a pattern on the surface of the edge step layer based on the patterned features, wherein contact between the imprint lithography template and the portion of the substrate between the first edge and the second edge is prevented based on the edge step layer of the one of the partial imprint fields.

2. The method of claim 1, wherein contact between the imprint lithography template and the portion of the substrate between the first edge and the second edge is prevented based on the height of the edge step layer.

3. The method of claim 1, wherein the edge step layer includes a sloped profile, and wherein contact between the imprint lithography template and the portion of the substrate between the first edge and the second edge is prevented based on the sloped profile of the edge step layer.

4. The method of claim 1, wherein contacting further includes identifying a degree of bending of the template at a perimeter of the substrate, wherein the height of the edge step layer is based on the degree of bending.

5. The method of claim 1, wherein the height of the edge step layer ranges from ten nanometers to three microns.

6. The method of claim 1, wherein the edge step layer includes a sloped profile, wherein contacting further includes identifying a degree of bending of the template at a perimeter of the substrate, and wherein a slope of the sloped profile at the perimeter of the substrate is based on the degree of bending.

7. The method of claim 1, wherein the edge step layer further includes fluid control features positioned proximate the second edge.

8. The method of claim 7, wherein the edge step layer includes a sloped profile, wherein contact between the imprint lithography template and the portion of the substrate between the first edge and the second edge is prevented based on i) the height of the edge step layer, and ii) the sloped profile of the edge step layer.

9. The method of claim 1, wherein contacting the polymerizable material on the edge step layer with the mold of the imprint lithography template comprises positioning the imprint lithography template relative to the substrate such that a gap is present between the imprint lithography template and the portion of the surface of the substrate.

10. The method of claim 1, wherein contacting the polymerizable material on the edge step layer with the mold of the imprint lithography template comprises positioning the imprint lithography template relative to the substrate such that a portion of patterning surface of the mold extends beyond the second edge of the edge step layer of the one of the partial imprint fields.

11. The method of claim 1, wherein contacting the polymerizable material on the edge step layer with the mold of the imprint lithography template comprises positioning the imprint lithography template relative to the substrate such that a portion of the imprint lithography template overhangs the first edge.

12. The method of claim 1, wherein contacting the polymerizable material on the edge step layer with the mold of the imprint lithography template comprises positioning the imprint lithography template relative to the substrate such that a portion of the imprint lithography template overhangs the second edge.

13. An imprint lithography method of manufacturing an article, the method comprising:

providing an imprint lithography template having a mold, the mold having a patterning surface comprising patterned features;

providing a substrate having a surface defining a first edge and an imprinting area having full imprint fields bounded by partial imprint fields, wherein each partial imprint field is bounded by up to two full imprint fields and has an edge step layer extending from the surface of the substrate, the edge step layer having a second edge a distance d from the first edge and a height h defined by a distance between the surface of the substrate and a surface of the edge step layer parallel to the surface of the substrate from which it extends, wherein a portion of the surface of the substrate between the first edge and the second edge is free of the edge step layer;

drop dispensing a polymerizable material on the surface of the edge step layer of one of the partial imprint fields;

contacting the polymerizable material on the edge step layer with the mold of the imprint lithography template, wherein contact between the imprint lithography template and the portion of the substrate between the first edge and the second edge is prevented based on the edge step layer of the one of the partial imprint fields;

polymerizing the polymerizable material to form a polymeric layer in contact with the imprint lithography template, the polymeric layer including a pattern based on the patterned features; and separating the imprint lithography template from the polymeric layer to yield the article.

* * * * *